United States Patent [19]

Dunki-Jacobs

[11] Patent Number: 4,641,276
[45] Date of Patent: Feb. 3, 1987

[54] SERIAL-PARALLEL DATA TRANSFER SYSTEM FOR VLSI DATA PATHS

[75] Inventor: Robert J. Dunki-Jacobs, Ballston Lake, N.Y.

[73] Assignee: General Electric Company, Schenectady, N.Y.

[21] Appl. No.: 663,609

[22] Filed: Oct. 22, 1984

[51] Int. Cl.[4] .............................................. G06F 13/40
[52] U.S. Cl. ........................................ 364/900; 370/86
[58] Field of Search ... 364/200 MS File, 900 MS File; 365/219, 83, 78, 220, 221; 377/37, 52, 54, 60, 64, 70, 75, 77, 115, 130; 370/86

[56] References Cited

U.S. PATENT DOCUMENTS

| | | | |
|---|---|---|---|
| 2,957,163 | 10/1960 | Kodis | 364/900 |
| 3,051,940 | 8/1962 | Fleckenstein | 377/75 |
| 3,713,096 | 1/1973 | Comfort et al. | 364/200 |
| 3,913,072 | 10/1975 | Catt | 364/900 |
| 3,992,699 | 11/1976 | Krumback | 365/78 |
| 4,048,673 | 9/1977 | Hendrie et al. | 364/200 |
| 4,144,561 | 3/1979 | Tu et al. | 364/200 |
| 4,179,747 | 12/1979 | Dlugos | 364/900 |
| 4,193,121 | 3/1980 | Fedida et al. | 365/78 |
| 4,333,161 | 6/1982 | Catt | 364/900 |
| 4,362,926 | 12/1982 | Dakovski et al. | 377/77 |
| 4,438,491 | 3/1984 | Constant | 364/200 |

Primary Examiner—James D. Thomas
Assistant Examiner—C. H. Lynt
Attorney, Agent, or Firm—Bernard J. Lacomis; James C. Davis, Jr.

[57] ABSTRACT

Serial data transfer circuitry is provided for transferring data between a multiplicity of functional units of a VLSI semiconductor chip. Each functional unit is provided with a respective data register, the registers being adapted to receive information in parallel from and/or transfer information in parallel to their respective functional units. The registers are each serially connected in a closed loop for serially shifting data from one register to another. Data transfer from one functional unit to another is accomplished by transferring a data word in parallel to a source register from its respective functional unit, serially shifting data from the source register to a destination register and parallelly transferring the data word from the destination register to its respective functional unit. Control of the transfer is provided by a counter which counts the number of shifts required to transfer the data word from the source to the destination register.

4 Claims, 4 Drawing Figures

SERIAL-PARALLEL DATA TRANSFER SYSTEM FOR VLSI DATA PATHS

BACKGROUND OF THE INVENTION

This invention relates in general to apparatus and method for data communication and, more particularly, to serial data path architecture for use with a very large scale integration semiconductor circuit.

Communication systems using parallel address and parallel data bus interconnection architecture for transferring data among memory locations, input/output (I/O) registers, processing elements and other functional units are well known. For typical VLSI semiconductor circuits these parallel interconnections among various functional units may occupy a large portion of available usable masking area which area may be more beneficially allocated for additional functional units and circuitry. Alternatively, reduction of the area required for address/data bus interconnection circuitry will enable the overall VLSI semiconductor circuit (typically referred to as a chip) size to be reduced. Further, usurpation of available masking area by address/data bus parallel interconnection circuitry among functional units increases as both bit width of data and address size increase.

Benefits realizable by reducing circuit size include increasing the yield of acceptable chips from a wafer and obtaining more chips from a given size wafer during manufacture. The increased yield is generally obtainable since the ratio of acceptable chips to the total number of chips produced from a wafer is inversely proportional to a function of the area of each chip. By obtaining more chips per wafer, the manufacturing cost per chip is reduced since the cost to process a wafer and form chips therefrom is relatively fixed.

It would therefore be desirable in the art of integrated circuitry to provide means and method for serial data transfer between the various functional units of a VLSI semiconductor chip.

Accordingly, it is an object of the present invention to provide serial data/address interconnection circuitry on a VLSI chip.

Another object of the present invention is to increase the number of functional units which can be placed on a semiconductor chip.

A further object of the present invention is to reduce the area of VLSI circuitry required for data/address interconnection circuitry among functional units on a VLSI semiconductor chip.

Still another object is to reduce the overall size of a semiconductor chip.

BRIEF SUMMARY OF THE INVENTION

The above noted and other objects of the invention are met by providing serial data transfer circuitry for transferring data between a multiplicity of functional units wherein the data transfer circuitry and functional units are both fabricated from the same material so as to form a semiconductor chip. The data transfer circuitry includes a multiplicity of data registers each associated with a respective one of said functional units for parallel data transfer therebetween. The data registers are serially connected with the input to the first register coupled to the output of the last register in a closed loop. Controlling means are provided to control the transfer of data between each of the functional units on the semiconductor chip by controlling the parallel transfer of data between registers and their respective functional units and controlling the serial transfer of data between registers.

A data transfer cycle includes the parallel transfer of data from a functional unit (hereinafter a source unit) to its respective source register, the serial transfer of data to a destination register and the parallel transfer of data to its respective functional unit (hereinafter a destination unit). With the communication system herein described, data can be serially transferred from any register to any other register within the loop and thus can be communicated between any of the functional units associated with a register within the loop.

BRIEF DESCRIPTION OF THE DRAWINGS

The invention, both as to organization and method of practice, can best be described from a reading of the detailed description taken in conjunction with the drawings in which applicable reference numerals have been carried forward.

DETAILED DESCRIPTION OF THE INVENTION

As mentioned hereinbefore, there exists a need to provide for the serial transfer of data between discrete functional units of a VLSI semiconductor circuit. As used herein, VLSI refers to integrated circuits containing about 100,000 transistors per chip of about 0.25 inch square or integrated circuits having an interconnecting line width less than about 1.5 micrometers. Serial data transfer between a multiplicity of functional units on a semiconductor chip is accomplished by including thereon a respective multiplicity of data registers serially connected in a closed loop, wherein each data register is associated with a functional unit for transferring information therebetween. A controller, which may or may not be fabricated from the same material as the data registers and their respective functional units, is provided to control the transfer of data between the functional units by controlling: the parallel transfer of data from a source unit to the source register (hereinafter a read operation), the serial transfer of data from the source register to the destination register (hereinafter a shift), and the parallel transfer of data from the destination register to the destination unit (hereinafter a write).

Figure 1:
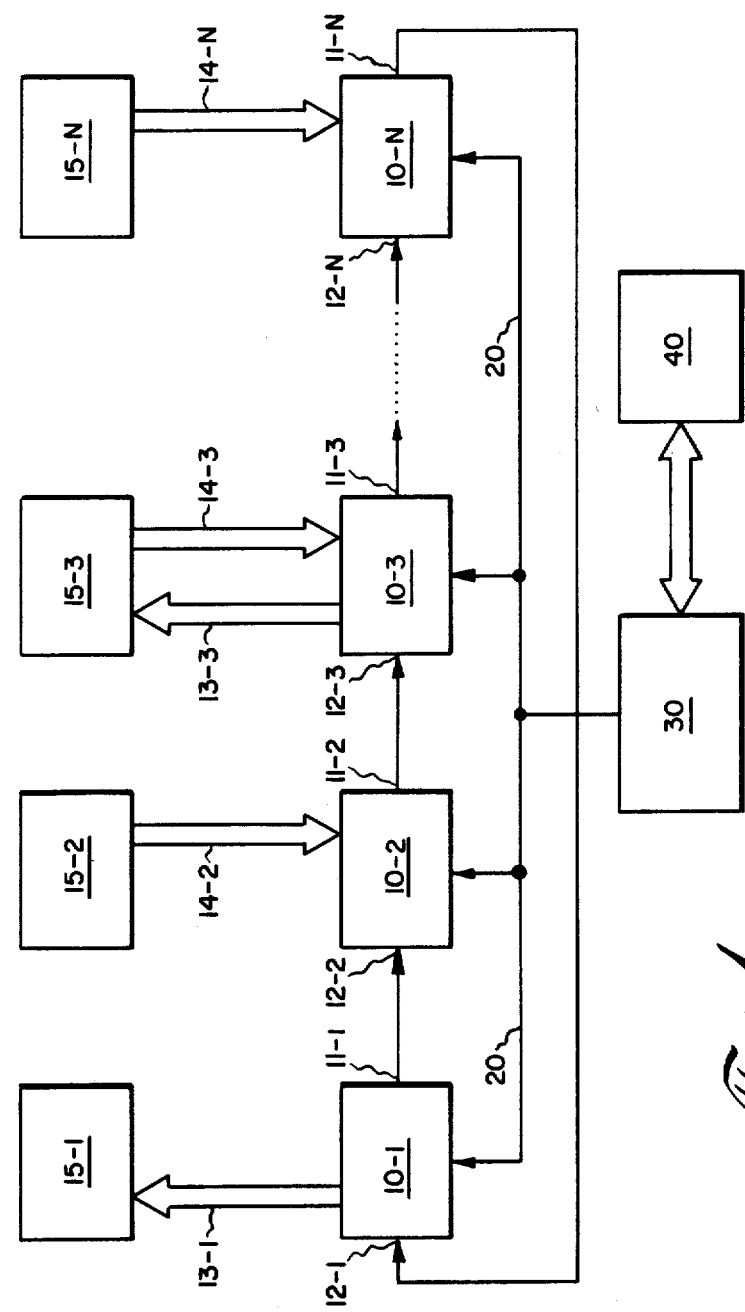
FIG. 1 is an illustrative block diagram showing the serial-parallel data communication system of the present invention.

With reference to FIG. 1, an illustrative block diagram is provided wherein a multiplicity of data registers 10-1 through 10-N are connected with the serial data output 11-1 of the first register 10-1 connected to the serial data input 12-2 of the second register 10-2. The serial data output 12-2 of the second register 10-2 is connected to the serial data input 12-3 of the third register 10-3, etc., with the serial data output 11-N of the last data register being connected to the serial data input 12-1 of the first register 10-1 thus forming a closed loop (hereinafter referred to as the serial data path).

Registers 10-1 through 10-N are each associated with a respective functional unit 15-1 through 15-N for transferring data therebetween. These functional units may be any device for manipulating, transferring and/or storing digital data, e.g. processors, memory, multiplexing units, etc.

Several registers, such as register 10-1, include a parallel data output port 13-1 for transferring digital data to its respective functional unit 15-1. Such registers may be designated as "write" registers. Other registers, such as register 10-2, include a parallel data input port 14-2 for receiving information from its respective functional unit 15-2. Such registers may be designated as "read" registers. Still other registers, such as register 10-3, include both a parallel data output port 13-3 and a parallel data input port 14-3 for respectively transferring information to, and receiving information from, its associated functional unit 15-3. Such registers may be designated as "read/write" registers. Alternatively, read/write register 10-3 may include a bidirectional parallel data port for transferring information to and receiving information from its associated functional unit 15-3. Although the present invention is illustrated and described as a system including each of the three types of registers, it will be apparent to one skilled in the art that a system can be created in accord with the present invention which uses any one or any combination of the three types, i.e. read, write or read/write registers.

Output ports 13 and input ports 14 of registers 10 each comprise a plurality of electrically isolated conducting means for the transfer of digital data bits to and from registers 10 and their associated functional units 15. Output ports 13 and input ports 14 may be of any bit length so long as they are compatible with the particular functional unit to which they are connected. The total number of data bits in the serial data path is equal to the sum of the data bits of each of registers 10-1 through 10-N.

Registers 10-1 through 10-N are shown connected to a controller 30 via a control bus 20. Although bus 20 is shown for convenience in FIG. 1 as one line, it actually comprises a plurality of conducting lines 26–29 (FIG. 2) for transferring a plurality of control signals from controller 30 to registers 10. As shown more fully in FIG. 2, controller 30 includes several outputs 36–39 connected to respective ones of conducting lines 26–29. Outputs 36–39 provide, respectively, a clock signal, a shift control signal, a write control signal and a read control signal.

Registers 10-1 through 10-N are each shown to include inputs 16 and 17 coupled respectively to controller outputs 36 and 37, via conductors 26 and 27, for receiving the clock signal and shift control signal provided by controller 30. Write register 10-1 is shown to include an input 18, coupled to output 38 of controller 30 via conductor 28, for receiving the write control signal provided by controller 30. Likewise, read registers 10-2 and 10-N are shown to include inputs 19, coupled to output 39 of controller 30 via conductor 29, for receiving the read control signal provided by controller 30. Lastly, read/write register 10-3 is shown to include inputs 18 and 19, coupled, respectively, to outputs 38 and 39 of controller 30 via conductors 28 and 29, for receiving the write control signal and the read control signal provided by controller 30.

Figure 2:
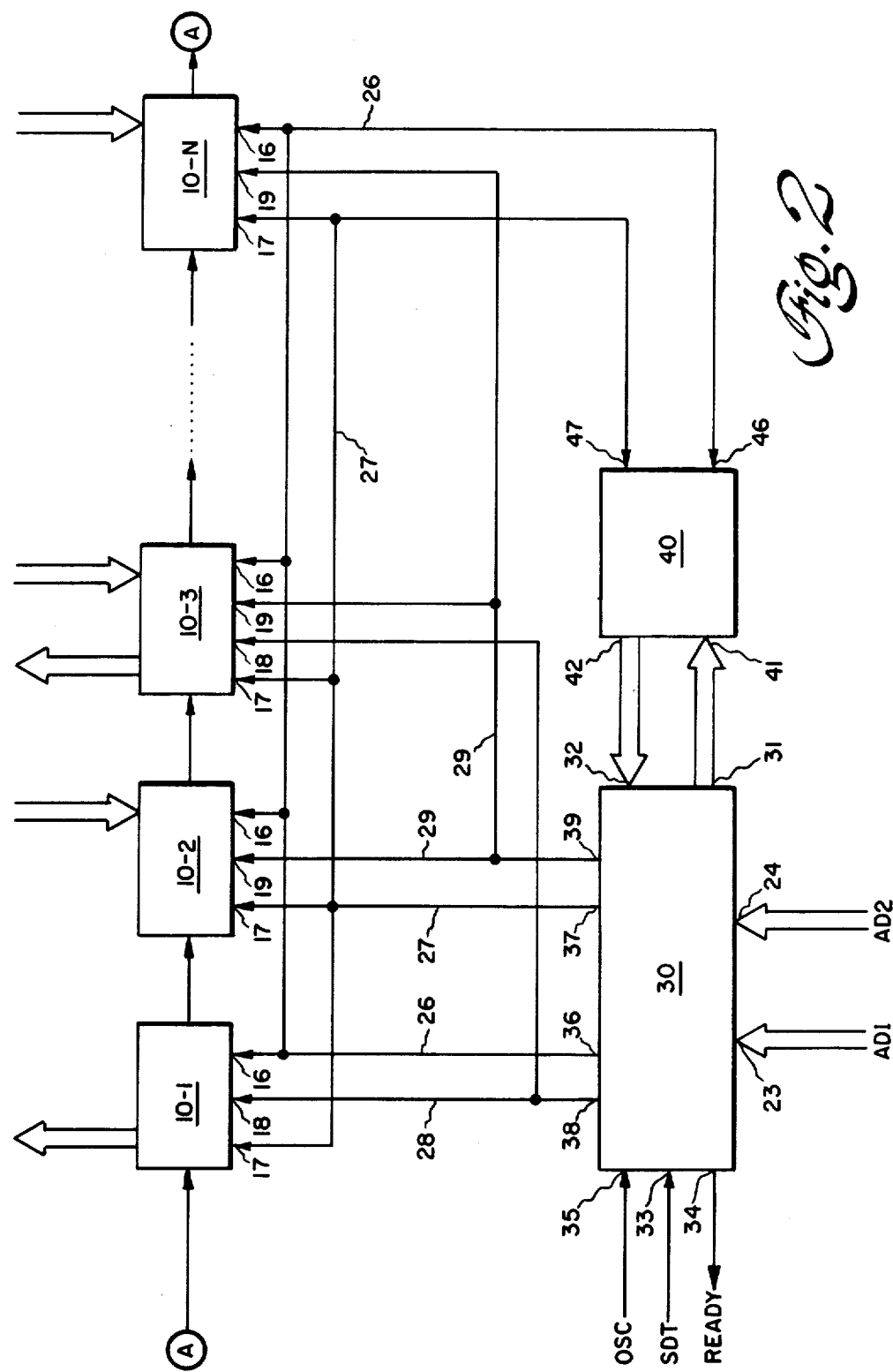
FIG. 2 is a more detailed block diagram showing the interconnection circuitry between the controller, the counter and the registers which comprise the communication system of the present invention.

Although only four registers are illustrated in FIG. 2, it is to be understood that the remaining registers 10-4 through 10-(N-1) are coupled to controller 30 as hereinabove described in accord with their operation as either a write register, a read register or a read/write register.

Figure 3:
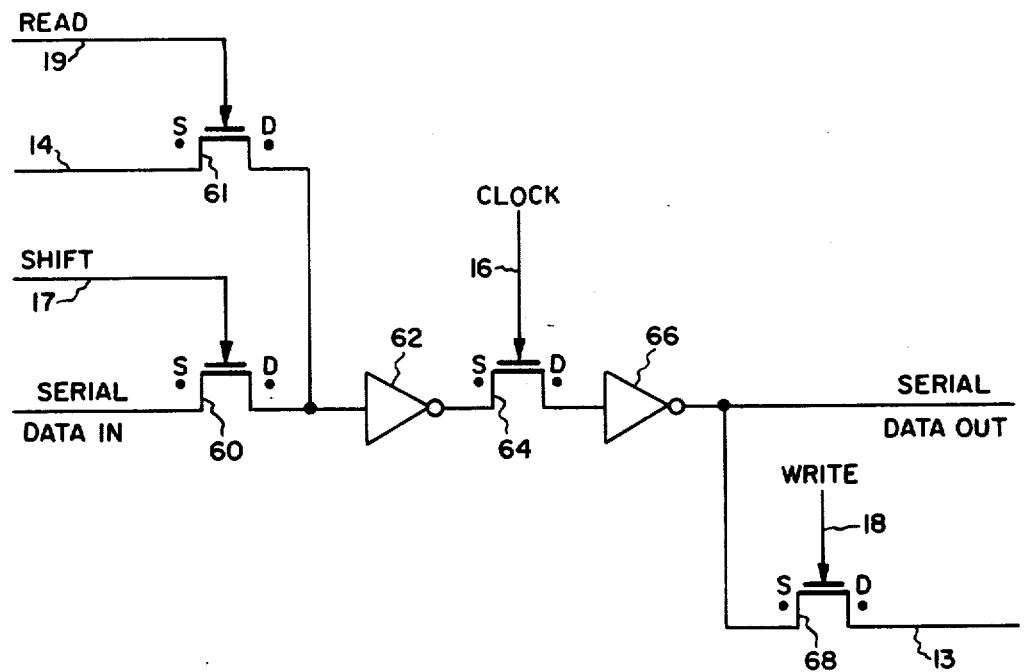
FIG. 3 is a detailed description of one stage of the registers for use with the present invention.

Referring to FIG. 3, a typical stage representing one bit of register 10 (FIG. 1) is shown. Both read and write functions are shown for ease of discussion. As mentioned hereinabove either or both of these functions may be used as appropriate. The register stage comprises transistors 60, 61, 64 and 68 and inverters 62 and 66. Transistors 60, 61, 64 and 68 typically comprise field effect transistors (FET). It is to be understood that when fabricated using VLSI manufacturing techniques, the gate is generally centrally placed within the transistor and thus the traditional terms "source" and "drain" lose their significance as either end of the transistor may be designated as one with the other end having the other designation. Thus all references in the present specification to "source" and "drain" are for convenience and ease of explanation only, and are not intended to prohibit or limit any appropriate connections.

The shift control signal provided to input 17 by controller output 37 is supplied to the gate of input transistor 60. Likewise, the read control signal provided to input 19 by controller output 39 is supplied to the gate of input transistor 61. The clock signal provided to input 16 by controller output 36 is supplied to the gate of transistor 64 and the write control signal provided to input 18 by controller output 38 is supplied to the gate of data transfer transistor 68. Source S of transistor 60 is coupled to the serial output of the next preceding serial stage of register 10 or to the serial data output of the next preceding register if the stage shown is the first serial stage of register 10. Drain D of transistor 64 is connected to the input of inverter 66 whose output is connected to source S of transistor 68. The output of inverter 66 also constitutes the serial data output of the stage shown which is coupled to the serial data input of the next following stage of register 10 or to the serial data input of the next following register 10 if the stage shown is the last serial stage of register 10.

During the interval in which the shift control signal is active, data is transferred from source S of transistor 60 to source S of transistor 64 through inverter 62, thereby shifting the data in register 10 one bit. Likewise during the interval when the read control signal is active, data is transferred from source S of transistor 61 to source S of transistor 64 through inverter 62. During the next active period of the clock signal, data is transferred from source S of transistor 64 to the output of inverter 66. Data is transferred from the output of inverter 66 to drain D of transistor 68, which constitutes the parallel output of the stage, when the read control signal is active. Drain D of transistor 68 is connected to a respective parallel output of register 10. It will be appreciated by one skilled in the art that the shift control signal and the clock signal must comprise digital signals which alternate between logic 1 and 0 and which are never concurrently active.

Counter 40 (FIG. 2) comprises a modulus counter for counting a specific number of events, usually clock pulses, and thereafter repeating the counting starting from zero. Such counters are typically referred to as modulus m counters or divide by m counters where they are designed to count m events. Counter 40 is adapted to be a modulus m counter where m is equal to the total number of bits within the serial data path. The design of counter 40 does not form part of the present invention and can be readily performed by one skilled in the art.

Controller 30 comprises an array of logic elements designed to provide the control outputs responsive to its inputs as described hereinbelow, e.g. controller 30 may comprise a general purpose microprocessor programmed to carry out the method herein described. The detailed design of controller 30 does not form part of the present invention and can be accomplished by several methods well known throughout the art.

Referring once again to FIG. 2, counter 40 is shown to include inputs 46 and 47, coupled respectively to controller outputs 36 and 37 via conductors 26 and 27, for receiving the clock signal and the shift control signal provided by controller 30. Also, counter 40 includes a parallel data input port 41 and a parallel data output port 42 coupled respectively to a parallel data output port 31 and a parallel data input port 32 of controller 30. Output ports 31 and 42 and input ports 41 and 32 each comprise a plurality of electrically isolated conductors for transferring and receiving electrical signals used to represent a digital data value.

In operation, controller 30 receives a fixed frequency oscillating signal (OSC), a serial data transfer (SDT) signal and two address signals (AD1 and AD2) at its inputs 35, 33, 23 and 24, respectively. The signals AD1 and AD2 correspond to the addresses of the source register and the destination register respectively. In the preferred embodiment controller 30 does not provide the addresses AD1 and AD2 to registers 10, instead the functional units are provided with the source address and the destination address in the same manner that these addresses are provided to controller 30. Hence, only the source unit will transfer data during a read operation and only the destination unit will accept data during a write operation. It will be understood that these addresses could also be provided to registers 10 such that only the source register will read data and only the destination register will write data during a data transfer cycle.

Figure 4:
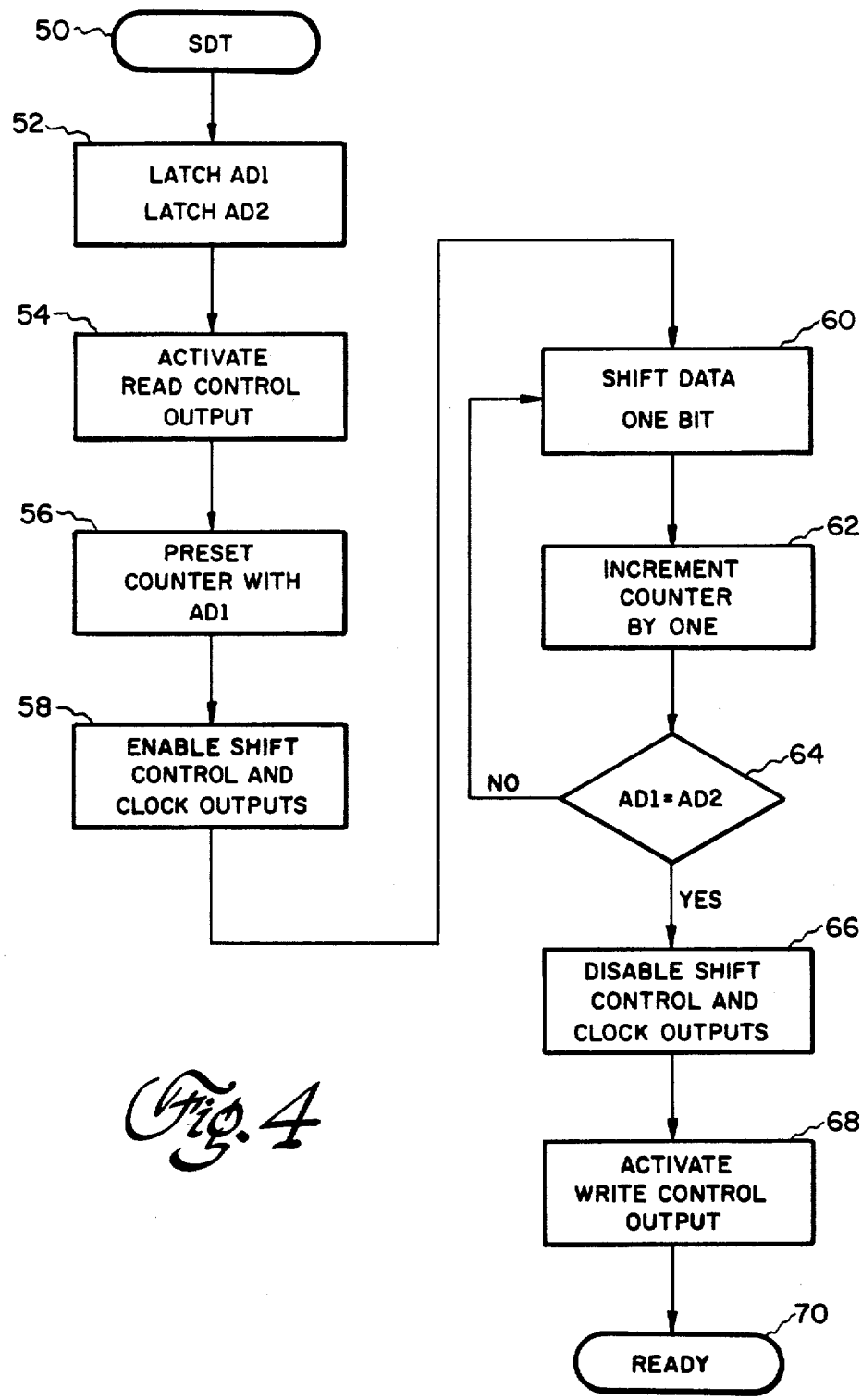
FIG. 4 is a decisional flow diagram depicting the steps which comprise the method of the present invention.

The operation of the system can best be described by referring to the decisional flow diagram of FIG. 4. The system indicates that it is ready to receive a SDT command by supplying an active ready signal at its output 34 (FIG. 2). Upon receipt of an SDT signal step 50, controller 30 latches the two address signals then present at its inputs 23 and 24, step 52. Controller 30 then activates read control output 39, step 54, thus issuing a read command to each of the read registers in the serial data path, thereby causing the transfer of data from the source unit to its respective source register.

After the read is completed, the system begins the serial transfer of data from the source register to the destination register. Controller 30 presets the count variable of counter 40 to the value of address AD1, step 56. The addresses AD1 and AD2 are equal to digital values which represent the number of data bits from a fixed bit, defined as zero, within the data path to the last bit of the addressed register, counting in the direction of serial data flow; the last bit of the register being defined by the stage which transfers data out of the register during a shift operation. Counter 40 receives, at its input port 41, the address AD1. The count variable of counter 40 is preset to this value such that it will increment this value by one upon each shift or bit displacement of the data within the serial data path.

To begin the serial shifting of data from the source register to the destination register, controller 30 issues a shift command by enabling its shift control output 37 and its clock output 36, step 58, causing each of registers 10-1 through 10-N to shift data one bit, as hereinabove described, step 60. Upon each bit displacement of the data within the serial data path, controller 30 increments the count variable of counter 40 by one, step 62. Controller 30 then checks count and AD2 for equality, step 64. If count is not equal to AD2, controller 30 returns to step 60 and continues shifting the data, one bit at a time, through the serial data path. If count and AD2 are equal, the subject data has arrived at the destination register and controller 30 disables its clock and shift control outputs 36 and 37, step 66, thereby ending the shift operation.

It will be appreciated that by using a modulus m counter where m is equal to the number of data bits in the serial data path, counting the address bits from a fixed bit in the direction of the serial data flow, and presetting counter 40 to the starting address, the count variable of counter 40 will at all times equal the bit address of the subject data during transfer thereof. Further, where the data passes through the aforementioned fixed bit, with the address equal to zero, the count variable of the modulus m counter will be equal to zero and will continue to count up from zero as the data continues to be shifted beyond the fixed bit through the data path.

After the shift is completed, indicated by the equality of the count variable and the address AD2, controller 30 activates write control output 38, step 68, and the destination register will transfer information to its respective functional unit. Controller 30 then activates ready output 34, step 70, thus indicating it is again available for a SDT command.

In an alternative embodiment, each register of the serial data path is constructed with the same number of digital data bits. Controller 30 is adapted to enable its clock output 36 for a discrete number of clock pulses necessary to shift the data from one register to its immediate neighboring register. Counter 40 is adapted as a modulus m counter where m is equal to the total number of registers within the serial data path. Addresses AD1 and AD2 are chosen to represent the source register and the destination register, respectively, and are defined by counting the number of data registers from a fixed register in the direction of serial data flow. In this embodiment, the controller enables the clock signal and the data is displaced within the serial data path one register, counter 40 is incremented by one and its count variable is compared to AD2 for equality. If they are not equal, the process is repeated until the count variable is equal to AD1.

In still another embodiment the serial data path is broken such that data is transferred serially on and off the chip. The serial data input and the serial data output of the first register and last register, respectively, are connected to an input pin and an output pin of the VLSI semiconductor chip. In this embodiment the controller and the counter may again be located either on or off the chip. The controller is adapted to provide three data transfer cycles, one for transferring data from one register to another as described hereinabove, another for transferring data to the functional units from off the chip, and a third for transferring data off the chip from the functional units. In this embodiment the source address and the destination address represent locations, i.e. registers, the chip input or the chip output, and are chosen by counting the bits of the registers from the chip input to the chip output, where the chip input is defined as address zero and the chip output is defined as the last or highest address. Hence, data can be transferred between any two locations, i.e. between the chip input, the chip output or the registers, as hereinabove described.

It is to be noted that in this embodiment, the system can be made to perform as hereinabove described simply by externally connecting the serial data output pin of the chip to the serial data input pin of the chip. It should be further understood that by cycling a set of known data through the system, without allowing the functional units to operate on this data or allowing only operations with known results, and thereafter cycling the data out of the register for examination, the system can be checked for connection or other faults occurring during fabrication.

Thus a system for the serial transfer of data between various functional units of a semiconductor chip has been disclosed. While only certain specific embodiments and preferred illustrations have been shown by way of example, many modifications and changes will occur to those skilled in the art. It is to be understood that the appended claims are intended to cover all such modifications and changes as fall within the true spirit and scope of the invention.

What I claim is:

1. Apparatus for transferring a multi-bit data word from a source functional unit to a destination functional unit, said units being two of a plurality of functional units on the same semiconductor chip, each said unit having a unique address, said apparatus comprising:
   a plurality of multi-stage registers, each such register coupled to a respective one of said units, said registers transferring said data in parallel to and from said units, said registers located on said chip and serially connected to each other with the input to the first register coupled to the output of the last register to form a closed loop serial data path;
   control means coupled to said registers and responsive to the addresses of said source and destination functional units for providing control signals to sequentially cause a parallel transfer of said data word from said source unit to its respective multi-stage register, a shifting of said data word through said registers in a manner to move said data word to the respective register of said destination unit, and a parallel transfer of said data word to said destination unit;
   wherein said control means includes:
      modulus m counting means for counting the bit displacement of said data word while said data word is shifted through said registers of said data path; and
      a controller coupled to said counting means for providing said control signals to said registers and for determining the number of shifts necessary to transfer said data word from said respective multi-stage register of said source unit to said respective multi-stage register of said destination unit by presetting said counting means to said source address and incrementing said counting means upon each shift of one bit of said data word until the count of said counting means is equal to said destination address whereupon said data word has been shifted the necessary number of bits to move said data word from said respective multi-stage register of said source unit to said respective multi-stage register of said destination unit.

2. The circuit as defined in claim 1 wherein said said control means are fabricated on the same semiconductor chip as said functional units and said registers.

3. The circuit as recited in claim 1 wherein said controller comprises a program controlled microprocessor.

4. A method for serially transferring data between a multiplicity of functional units of a semiconductor chip, wherein said chip includes a plurality of data registers serially connected to each other with the input to the first register coupled to the output of the last register to form a closed loop serial data path with each register coupled to a respective one of said functional units, and wherein said registers include parallel data ports for transferring data to and from their respective functional units, said chip further including means for controlling the operation of said registers and modulus m counting means coupled to said controlling means wherein m is equal to the total number of bits in said serial data path, said method comprising the steps of:
   (a) assigning a unique address to each of said registers, said address corresponding to a digital value which represents the number of data bits from a fixed bit within said serial data path to the last bit of the register to be addresed, counting in the direction of serial data flow;
   (b) latching first and second addresses into said controlling means, said first and second addresses corresponding to the respective address of a source register and a destination register;
   (c) presetting the count of said counting means with said first address;
   (d) transferring the data to said source register from its respective source unit;
   (e) serially shifting said data one bit in said data path;
   (f) incrementing said count by one;
   (g) comparing said count to said second address for equality;
   (h) repeating steps e–g if said count is not equal to said second address; and
   (i) transferring said data to the respective functional unit of said destination register when said count variable is equal to the address of said destination unit.

* * * * *